(12) United States Patent
Woo et al.

(10) Patent No.: US 6,346,479 B1
(45) Date of Patent: Feb. 12, 2002

(54) METHOD OF MANUFACTURING A SEMICONDUCTOR DEVICE HAVING COPPER INTERCONNECTS

(75) Inventors: Christy Mei-Chu Woo, Cupertino; Pin-Chin Connie Wang, Menlo Park, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/593,669

(22) Filed: Jun. 14, 2000

(51) Int. Cl.[7] ............................................. H01L 21/44
(52) U.S. Cl. ..................... 438/687; 438/625; 438/626; 438/627
(58) Field of Search ................... 438/687, 633, 438/692, 693, 625–627, 754, 756, 757

(56) References Cited

U.S. PATENT DOCUMENTS

| | | | |
|---|---|---|---|
| 5,766,379 A | 6/1998 | Lanford et al. | 148/537 |
| 5,814,557 A | 9/1998 | Venkatraman et al. | 438/622 |
| 5,891,802 A | 4/1999 | Tao et al. | 438/656 |
| 6,010,960 A | 1/2000 | Nogami | 438/653 |
| 6,022,808 A | 2/2000 | Nogami et al. | 438/694 |
| 6,130,156 A | 10/2000 | Havemann et al. | 438/637 |
| 6,136,707 A * | 10/2000 | Cohen | 438/687 |
| 6,140,241 A * | 10/2000 | Shue et al. | 438/692 |
| 6,168,704 B1 * | 1/2001 | Brown et al. | 205/118 |
| 6,171,960 B1 | 1/2001 | Lee | 438/687 |
| 6,207,222 B1 | 3/2001 | Chen et al. | 427/97 |
| 6,228,759 B1 * | 5/2001 | Wang et al. | 438/625 |

FOREIGN PATENT DOCUMENTS

| | | |
|---|---|---|
| EP | 0 856 884 A2 | 8/1998 |
| WO | WO 00/04573 | 1/2000 |

* cited by examiner

*Primary Examiner*—David Nelms
*Assistant Examiner*—Dung A Le
(74) *Attorney, Agent, or Firm*—Harrity & Snyder, L.L.P.

(57) ABSTRACT

A copper interconnect is formed by creating an opening in a dielectric layer. Copper is then deposited in a nonconformal electroplating process to fill a portion of the opening. A second electroplating process is then performed to conformally deposit copper in the remaining unfilled portion of the opening. The resulting deposition of the copper is more uniform and planar, thereby facilitating subsequent planarization of the semiconductor device.

17 Claims, 9 Drawing Sheets

METHOD OF MANUFACTURING A SEMICONDUCTOR DEVICE HAVING COPPER INTERCONNECTS

CROSS-REFERENCE TO RELATED APPLICATIONS

This application is related to the following commonly assigned, copending application: Ser. No. 09/593,231 filed Jun. 14, 2000, entitled COPPER INTERCONNECTS WITH IMPROVED ELECTROMIGRATION RESISTANCE AND LOW RESISTIVITY.

TECHNICAL FIELD

The present invention relates to a method of manufacturing a semiconductor device having copper interconnects. The present invention has particular applicability to manufacturing high density semiconductor devices with submicron design features.

BACKGROUND ART

The escalating requirements for high density and performance associated with ultra large scale integration semiconductor devices require design features of 0.25 microns and under, increased transistor and circuit speeds, high reliability and increased manufacturing throughput. The reduction of design features to 0.25 microns and under challenges the limitations of conventional methodology.

Conventional semiconductor devices typically comprise a semiconductor substrate, normally made of monocrystalline silicon, and multiple dielectric and conductive layers formed thereon. In a conventional semiconductor device 100 illustrated in FIG. 1, substrate 1 is provided with field oxide 2 for isolating an active region including source/drain regions 3, and a gate electrode 4, typically of doped polysilicon, above the semiconductor substrate with gate oxide 5 therebetween. Interlayer dielectric layer 6, typically silicon dioxide, is then deposited thereover and openings formed using conventional photolithographic and etching techniques. The openings are filled with conductive material to establish electrical contact between subsequently deposited conductive layer 8 and source/drain regions 3 through contacts 7, and to transistor gate electrode 49. Dielectric layer 9, typically silicon dioxide, is deposited on conductive layer 8, and another conductive layer 10, typically aluminum or an aluminum-base alloy, formed on dielectric layer 9 and electrically connected to conductive layer 8 through vias 11.

With continued reference to FIG. 1, conductive layer 10 is the uppermost conductive layer and, hence, constitutes the wire bonding layer. Dielectric layer 12, also typically silicon dioxide, is deposited, and a protective dielectric scratch resistant topside layer 13 is deposited thereon. Protective dielectric layer 13 typically includes a nitride layer, such as silicon nitride ($Si_3N_4$). Alternatively, protective dielectric layer 13 may include a dual topcoat comprising a nitride layer on an oxide layer. The protective dielectric layer 13 provides scratch protection to the semiconductor device 100 and protection against moisture and impurity contamination during subsequent processing. After deposition of protective dielectric layer 13, conventional photolithographic etching techniques are employed to form an opening to expose wire bonding layer 10 for external connection via bonding pad 14 and electrically conductive wires 15 or an external connection electrode (not shown).

Although only two conductive layers 8 and 10 are depicted in FIG. 1 for illustrative convenience, conventional semiconductor devices may include more than two conductive layers, e.g., five conductive metal layers, depending on design requirements. Also in the interest of illustrative convenience, FIG. 1 does not illustrate any particular type of plug or barrier layer technology. However, such technology is conventional and, therefore, the details of such features are not set forth herein.

As device features continue to shrink in size, the interconnects, such as contacts 7 and vias 11 enable the semiconductor device 100 to offer more packing density, higher speeds and more flexibility in circuit design. Various metals, such as aluminum and aluminum-base alloys, have typically been used to form the interconnects. More recently, copper and copper-base alloys have also been used to form the electrical interconnects. In such cases, the copper is typically deposited via a single electroplating process. That is, a single plating solution employing one type of plating chemistry is supplied to an electroplating chamber where the electroplating proceeds to fill the openings that will form the interconnects. The plating solution is typically recirculated to process in excess of 1000 wafers before being discarded.

The filling of small features via electroplating depends heavily on the plating solution chemistry. For example, some plating solutions are designed for bottom-enhanced filling. That is, the plating solution includes additives designed to fill the bottom portion of an opening more quickly than other portions of the opening. Unfortunately, these-bottom enhanced chemistries lead to preferential filling over certain features. For example, FIG. 2 illustrates a dielectric layer 22 with openings 24a–e and 26 formed on a semiconductor substrate 20. Electroplating semiconductor device 200 with a bottom-enhanced plating chemistry may leave excessive plating materials 28 above features located close together, such as openings 24a–e, as illustrated in FIG. 2. Excessive plating materials may also form over openings such as opening 26. In addition, in openings with high aspect ratios, such as openings 24a–e, the sidewalls of the openings may close in before the bottom portion has completely filled, thereby leaving a void in the opening. The void may cause problems with electrical continuity and may further add to excessive plating materials being deposited above the openings.

Other plating chemistries are designed to conformally fill various features. That is, the plating solution fills all portions of the openings equally. As a result, a conformally deposited layer 29 typically leaves an uneven topography across the wafer, as illustrated in FIG. 3.

In both cases, i.e., bottom-enhanced filling and conformal filling, the non-uniform, non-planar result of the electroplating poses a challenge to subsequent processes, such as chemical-mechanical polishing (CMP). For example, performing CMP on semiconductor device 200 of FIG. 2 to remove the excessive plating materials 28 may result in significant erosion of the dielectric layer 22. Additionally, performing a CMP on semiconductor device 200 of FIG. 3 may result in "dishing," of the openings. That is, the CMP may remove some conductive material in the openings, such as opening 26, below the level of the upper surface of the dielectric layer 22, as illustrated by the dashed lines in FIG. 3. These problems associated with performing CMP may adversely affect the performance of the interconnects.

DISCLOSURE OF THE INVENTION

There exists a need for methodology for forming copper interconnects that facilitates subsequent planarization and improves interconnect performance.

These and other needs are met by the present invention, where two or more plating chemistries are employed to fill openings for forming copper interconnects. The resulting topography is more planar and facilitates subsequent planarization.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to the present invention, the foregoing and other advantages are achieved in part by a method of forming an interconnect in a semiconductor device. The method includes forming an opening in a dielectric layer and depositing copper to fill a portion of the opening using a first plating process. The first plating process employs a first plating solution designed for non-conformal filling of the opening. The method also includes depositing copper to fill the opening using a second plating process. The second plating process employs a second plating solution designed for conformally filling the opening. The method further includes planarizing the semiconductor device so that the copper-filled opening is substantially coplanar with an upper surface of the dielectric layer.

According to another aspect of the invention, a method of manufacturing a semiconductor device includes forming a plurality of levels of dielectric layers and conductive layers on a semiconductor substrate. The method also includes forming an opening in at least one of the dielectric layers, supplying a first plating solution to an electroplating chamber and depositing copper to fill a portion of the opening. The first plating solution is designed for non-conformal filling of the opening. The method further includes terminating the supply of the first plating solution after the portion is deposited, supplying a second plating solution to the electroplating chamber and depositing copper to fill the opening. The second plating solution is designed for conformal filling of the opening.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawing s, w herein elements having the same reference number designation represent like elements throughout.

BEST MODE FOR CARRYING OUT THE INVENTION

Figure 1:
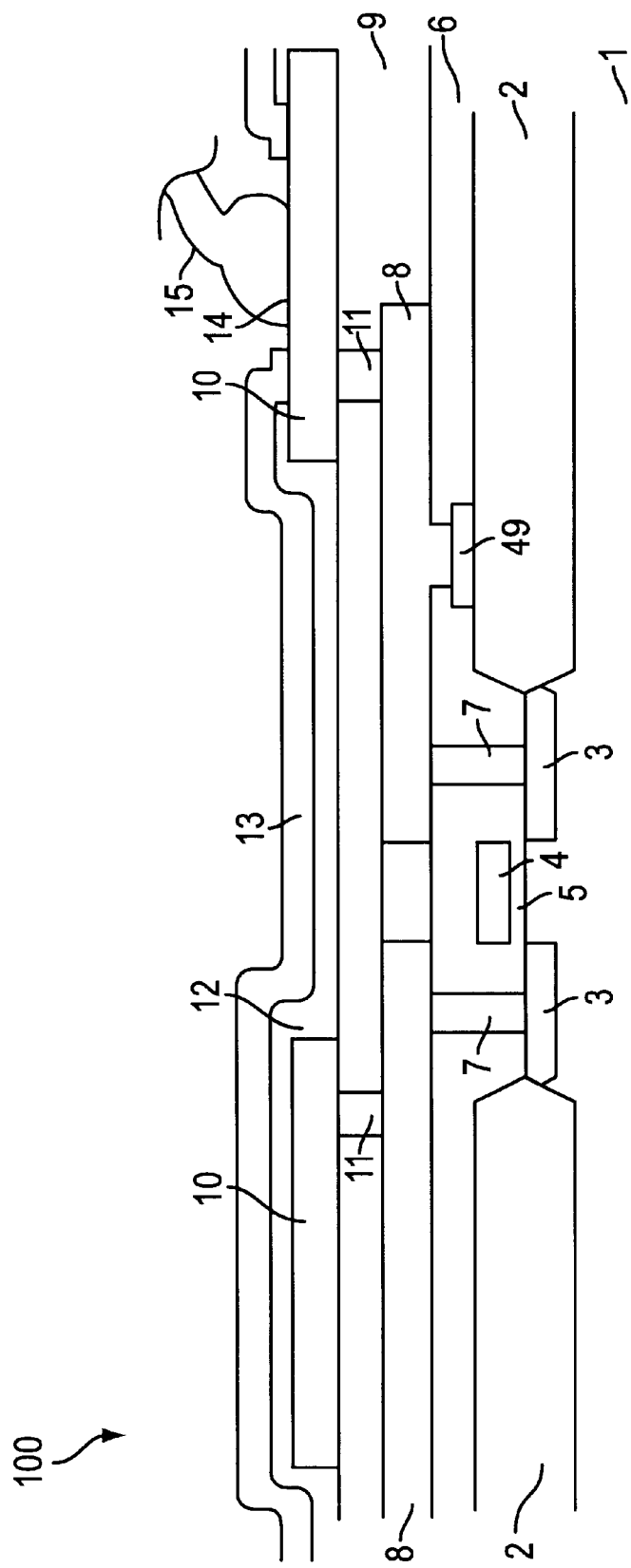
FIG. 1 schematically illustrates the cross-section of a conventional semiconductor device.
Figure 2:
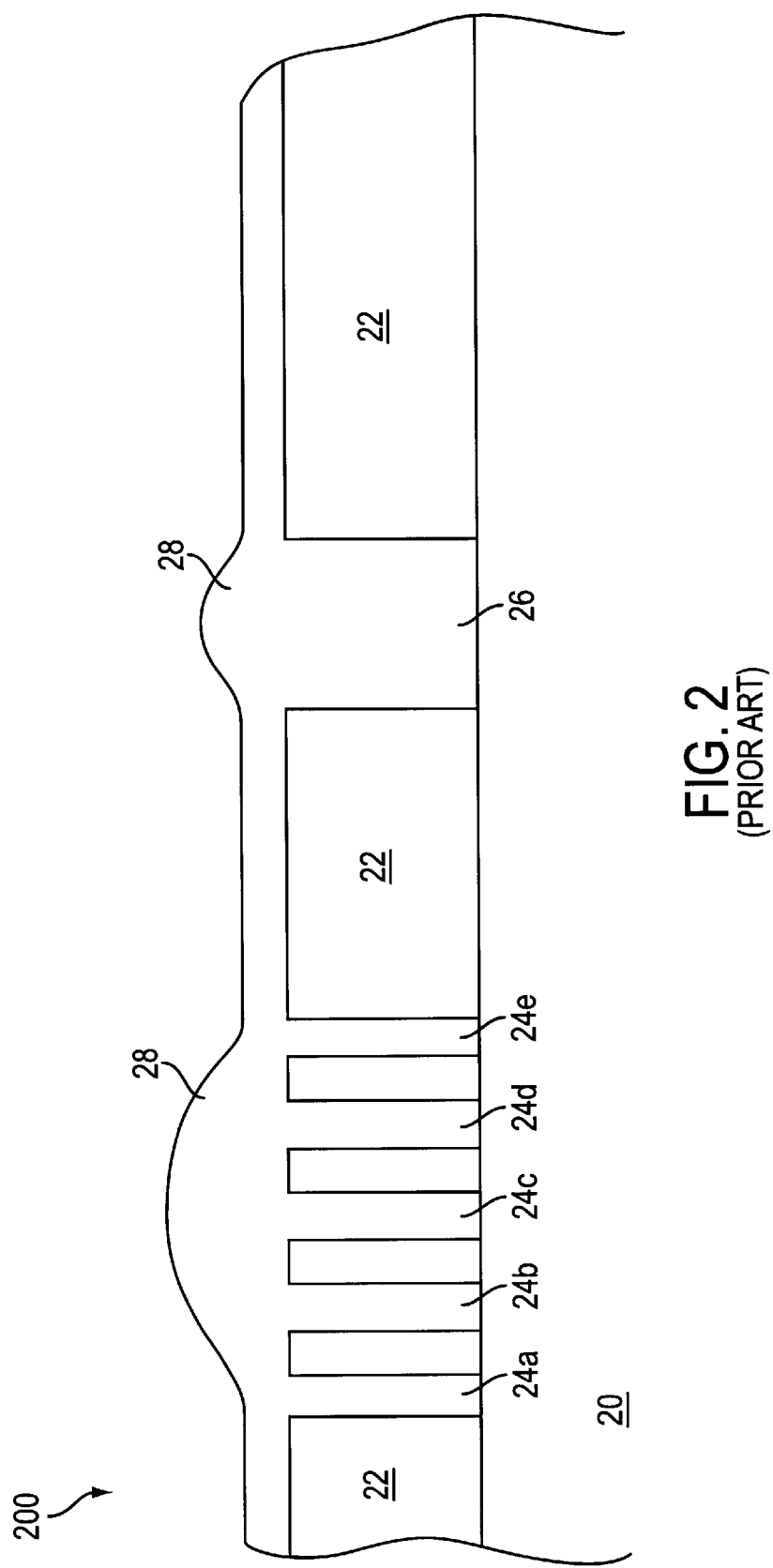
FIG. 2 schematically illustrates a conventional semiconductor device employing bottom-enhanced electroplating.
Figure 3:
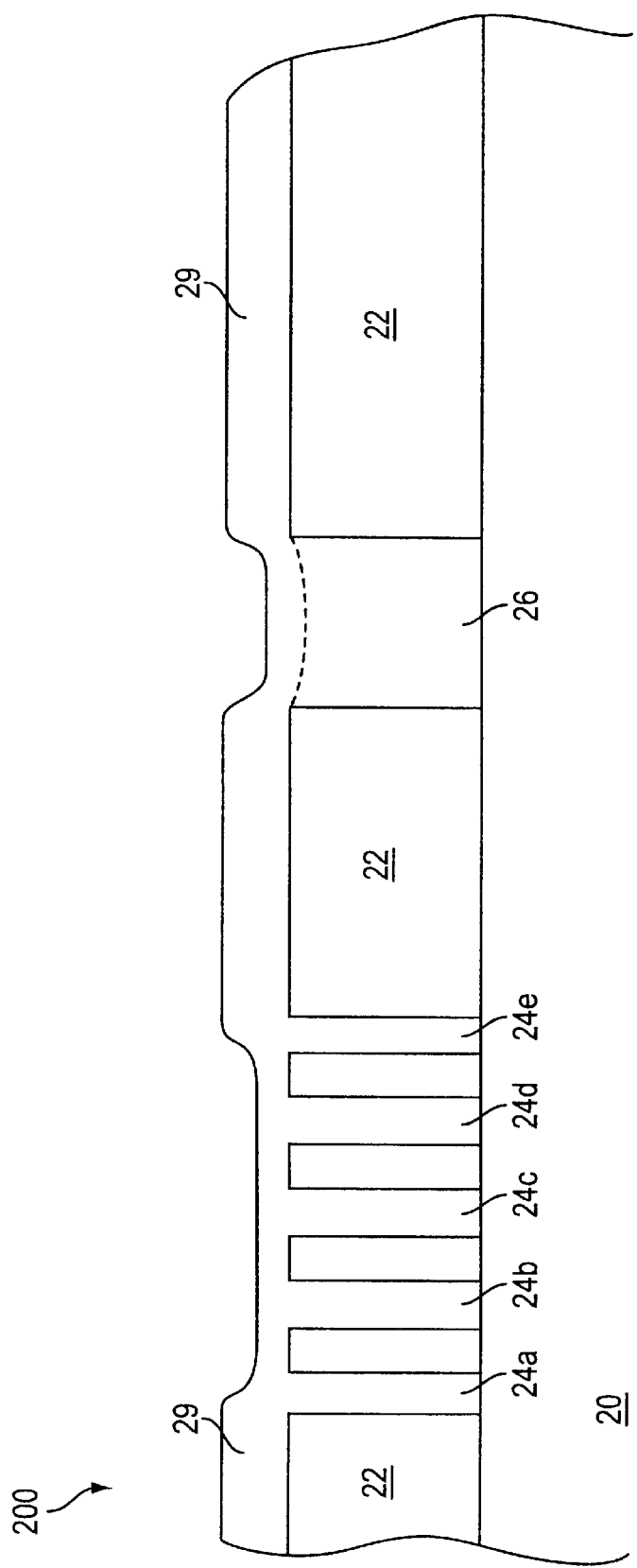
FIG. 3 schematically illustrates a conventional semiconductor device employing conformal electroplating.
Figure 4:
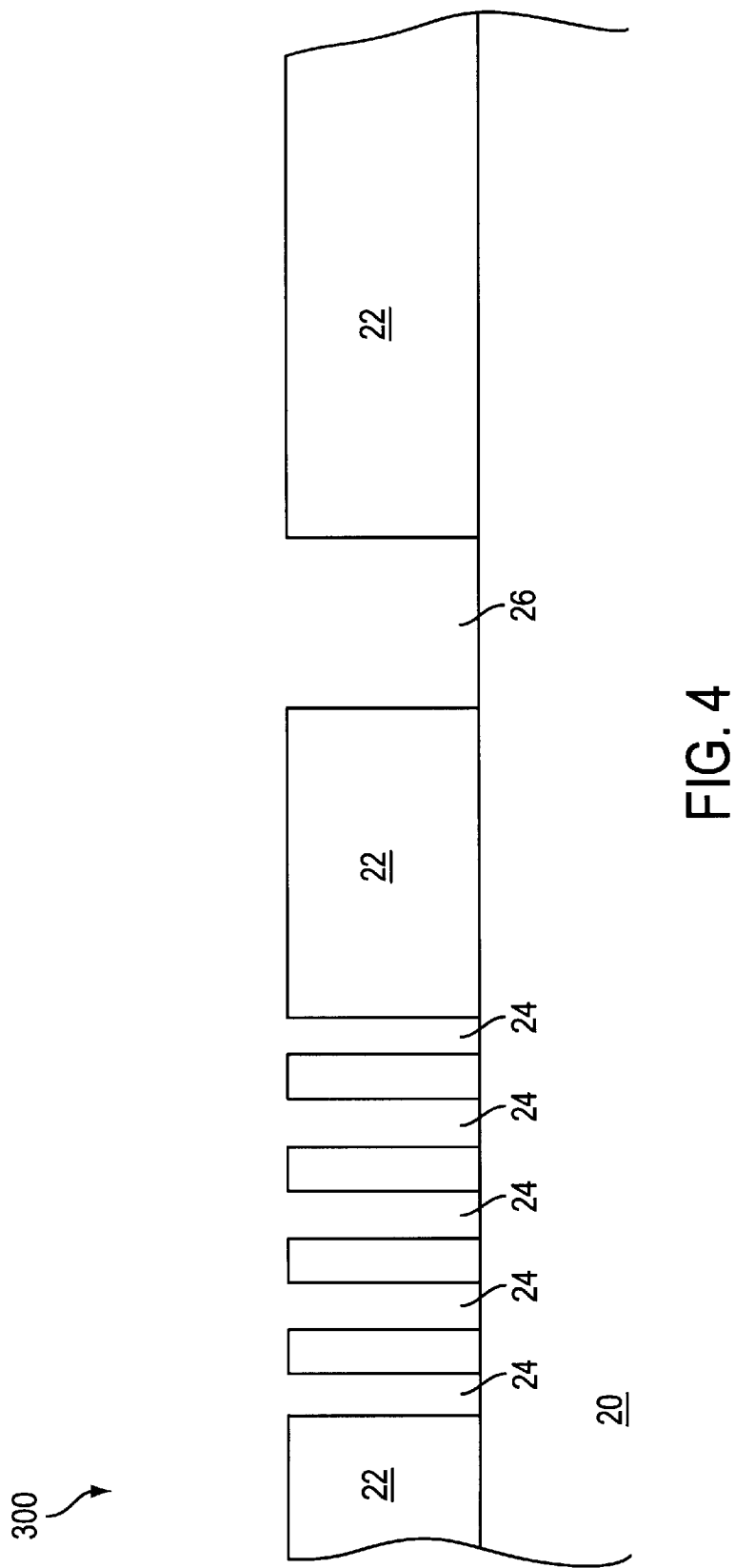
FIG. 4 illustrates the formation of interconnect openings in a dielectric layer in accordance with an embodiment of the present invention.

The present invention addresses and solves the problems associated with forming copper interconnects by employing two plating processes to form the interconnects. FIG. 4 illustrates the cross-section of a semiconductor device 300 formed in accordance with an embodiment of the present invention. Referring to FIG. 4, a dielectric layer 22, such as silicon dioxide or another material having a low dielectric constant (K), is formed above semiconductor substrate 20, typically comprising monocrystalline silicon. The dielectric layer 22 is shown directly above the substrate 20. It should be understood, however, that dielectric layer 22 may be an interlayer dielectric formed a number of layers above the surface of semiconductor substrate 20. For example, dielectric layer 22 may be an interlayer dielectric formed above a number of conductive layers and other dielectric layers (not shown) in semiconductor device 300.

Openings 24 and 26 are formed in dielectric layer 22 using conventional photolithographic and etching techniques. These openings 24 and 26 represent holes for forming contacts or vias or trenches for forming interconnect lines. In FIG. 4, five openings 24 having high aspect ratios and in close proximity with each other and one trench 26 having a lower aspect ratio are shown for simplicity and to illustrate various sized openings. The present invention, however, may be used to form any number of interconnects having any particular feature sizes and aspect ratios, based on the particular circuit requirements.

Figure 5:
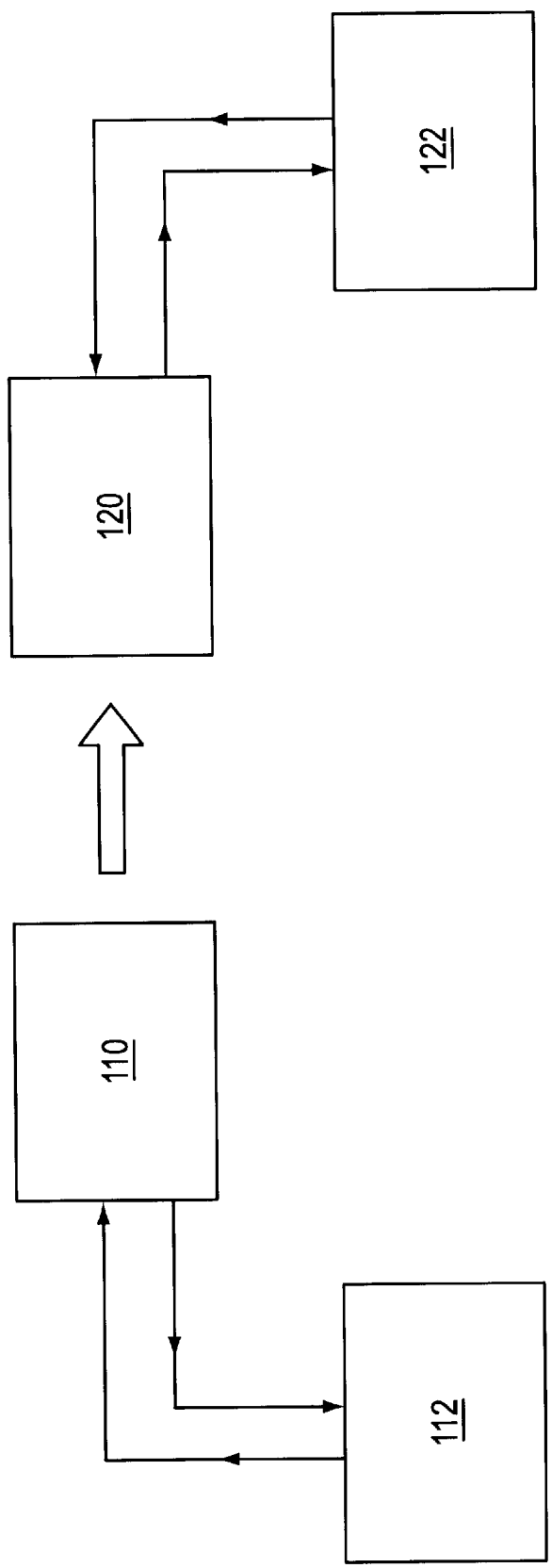
FIG. 5 is a block diagram illustrating a plating process, in accordance with an embodiment of the present invention.

As described above, conventional practices for forming interconnects use a single plating solution to completely fill the openings 24 and 26. The present invention departs from conventional practices by employing two separate plating solutions having different plating chemistries to fill the openings 24 and 26. According to an exemplary embodiment of the present invention, the plating solutions may be prepared in separate plating chambers, as illustrated in FIG. 5. In this embodiment, the semiconductor device 300 is placed in plating chamber 110. Plating chamber 110 may be any conventional electroplating chamber. The plating solution is prepared and mixed in plating solution tank 112 and supplied to the plating chamber 110 in a conventional manner. The plating solution is also re-circulated back to the plating solution tank 112 so that the solution may be used with a number of semiconductor wafers. Details of the plating chamber 110 and the devices, such as pumps, valves, etc., for supplying the plating solution from the plating solution tank 112 to the plating chamber 110 are well known and are not shown in order not to unduly obscure the thrust of the present invention.

According to an exemplary embodiment of the present invention, the first plating process employs a plating solution that includes additives that enhance bottom filling of openings 24 and 26. Any conventional additive chemistry that is designed to enhance bottom filling, such as Nanoplate 2001 or Ultrafill 2001, both manufactured by Shipley Company of Marlborough Mass., may be mixed with the plating solution used in the first plating process. Other plating chemistries designed to enhance the filling of the bottom portion of openings may also be used.

Figure 6:
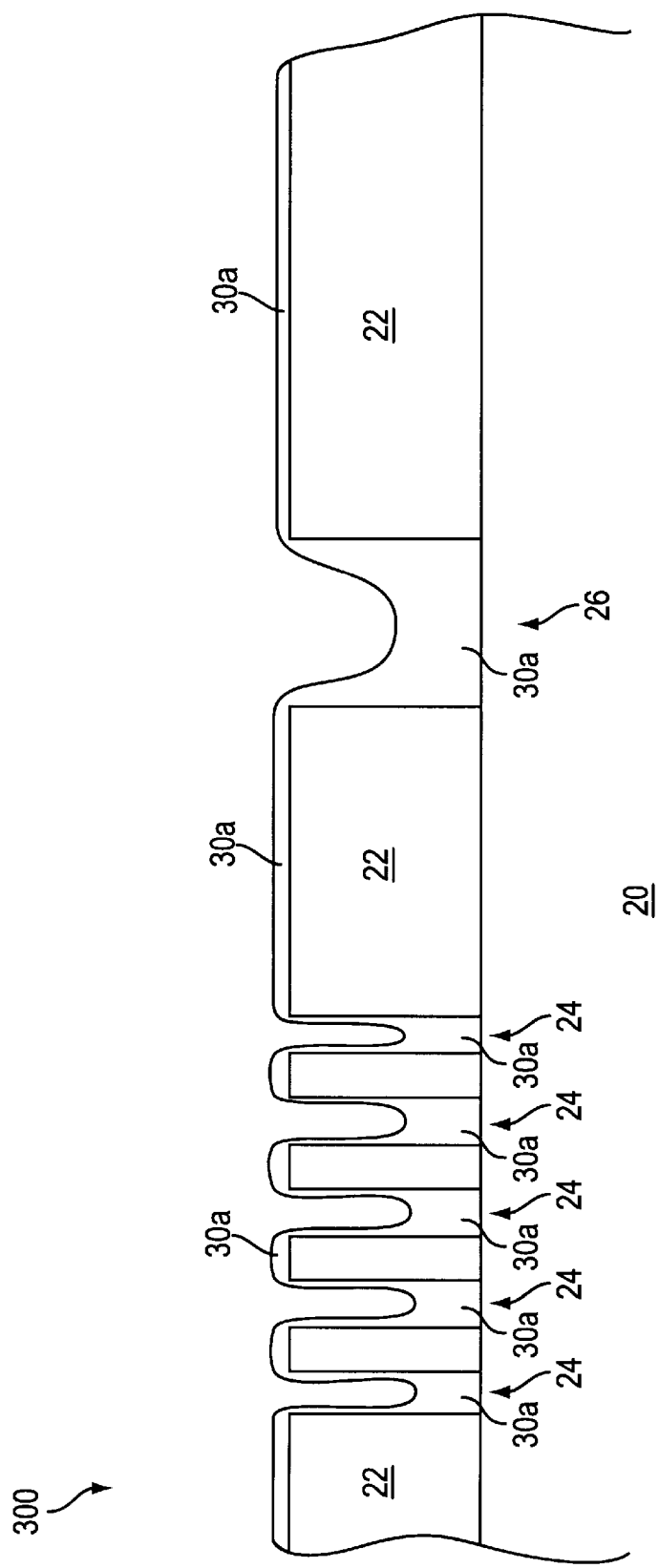
FIG. 6 illustrates the cross-section of the semiconductor device of FIG. 4 after a first electroplating, in accordance with an embodiment of the present invention.

Power is supplied to the electroplating chamber 110 where the semiconductor device 300 acts as one of the two electrodes. The electroplating proceeds to deposit copper into the openings 24 and 26. The electroplating is monitored so that a predetermined amount of copper is deposited in the openings 24 and 26. According to an exemplary embodiment of the present invention, the electroplating proceeds until a layer of copper 30a (FIG. 6) is deposited on semiconductor device 300 so that about 40% to about 90% of each of the openings 24 and 26 are filled. For example, FIG. 6 shows the openings 24 and 26 being about 70% filled, in accordance with the present invention. Given the guidance disclosed herein, the particular percentage that the copper 30a fills the openings 24 and 26 may be optimized to ultimately result in a more uniform and planar deposition of the copper, as described in more detail below, while also reducing the possibility of voids in the interconnects.

Figure 7:
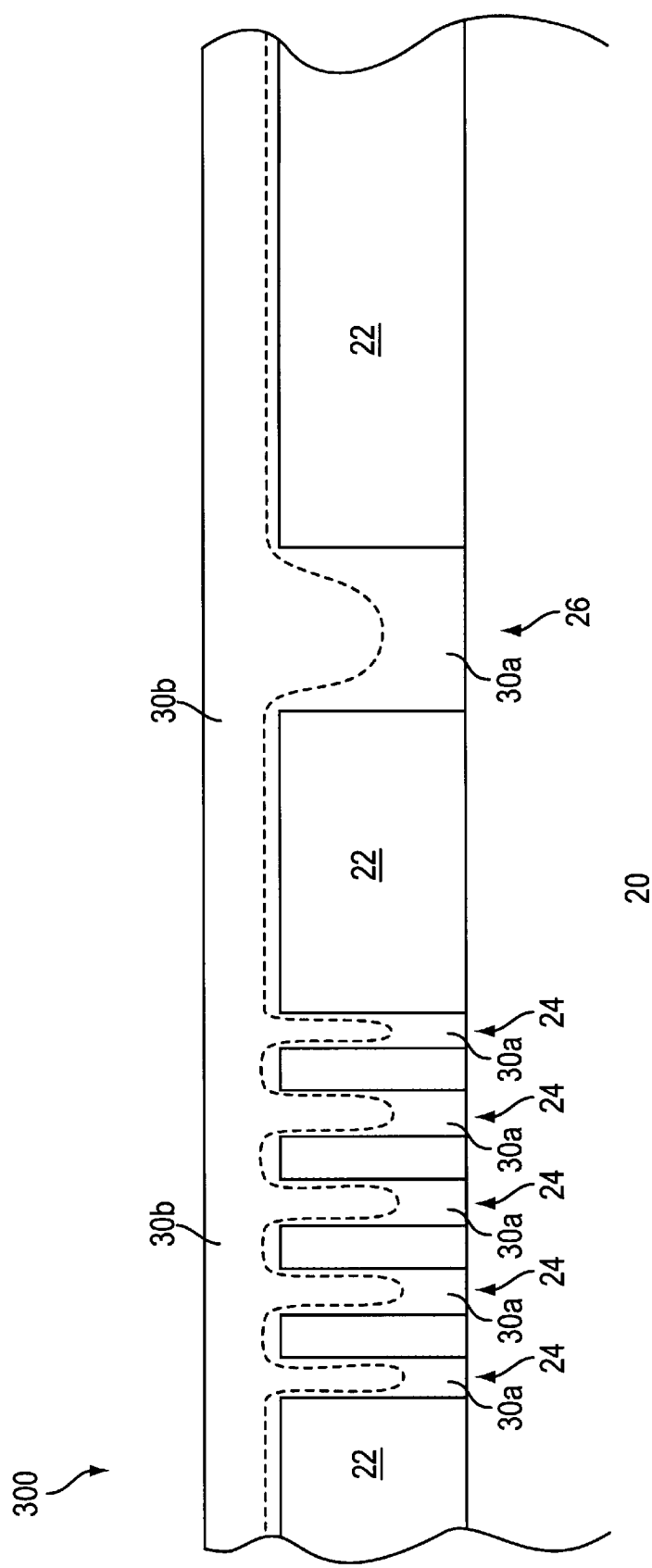
FIG. 7 illustrates the cross-section of the semiconductor device of FIG. 4 after a second plating, in accordance with an embodiment of the present invention.

The semiconductor device 300 is then moved to plating chamber 120 (FIG. 5). Plating chamber 120 employs a different plating chemistry than chamber 110. According to an exemplary embodiment, the plating solution for the second plating is designed for conformal filling of openings, such as openings 24 and 26. The plating solution is prepared in plating solution tank 122 and supplied to plating chamber 120 in a conventional manner. Power is supplied to the plating chamber 120 where the semiconductor device 300 acts as one of the two electrodes and the electroplating proceeds to deposit copper layer 30b in the unfilled portions of the openings 24 and 26, as illustrated in FIG. 7. In FIG. 7, the layers 30a and 30b are depicted as separated by a dotted line for illustrative purposes. It should be understood, however, that layers 30a and 30b form a continuous copper layer with no boundaries. Advantageously, using a conformal filling chemistry after the bottom-enhanced filling chemistry enables the semiconductor device 300 to receive a more uniform and planar plating of copper, as illustrated in FIG. 7. As a result, subsequent planarization steps, such as chemical-mechanical polishing (CMP) of the semiconductor device 300 causes less erosion of dielectric layer 22 and less dishing of the interconnect structures formed in openings 24 and 26.

Figure 8:
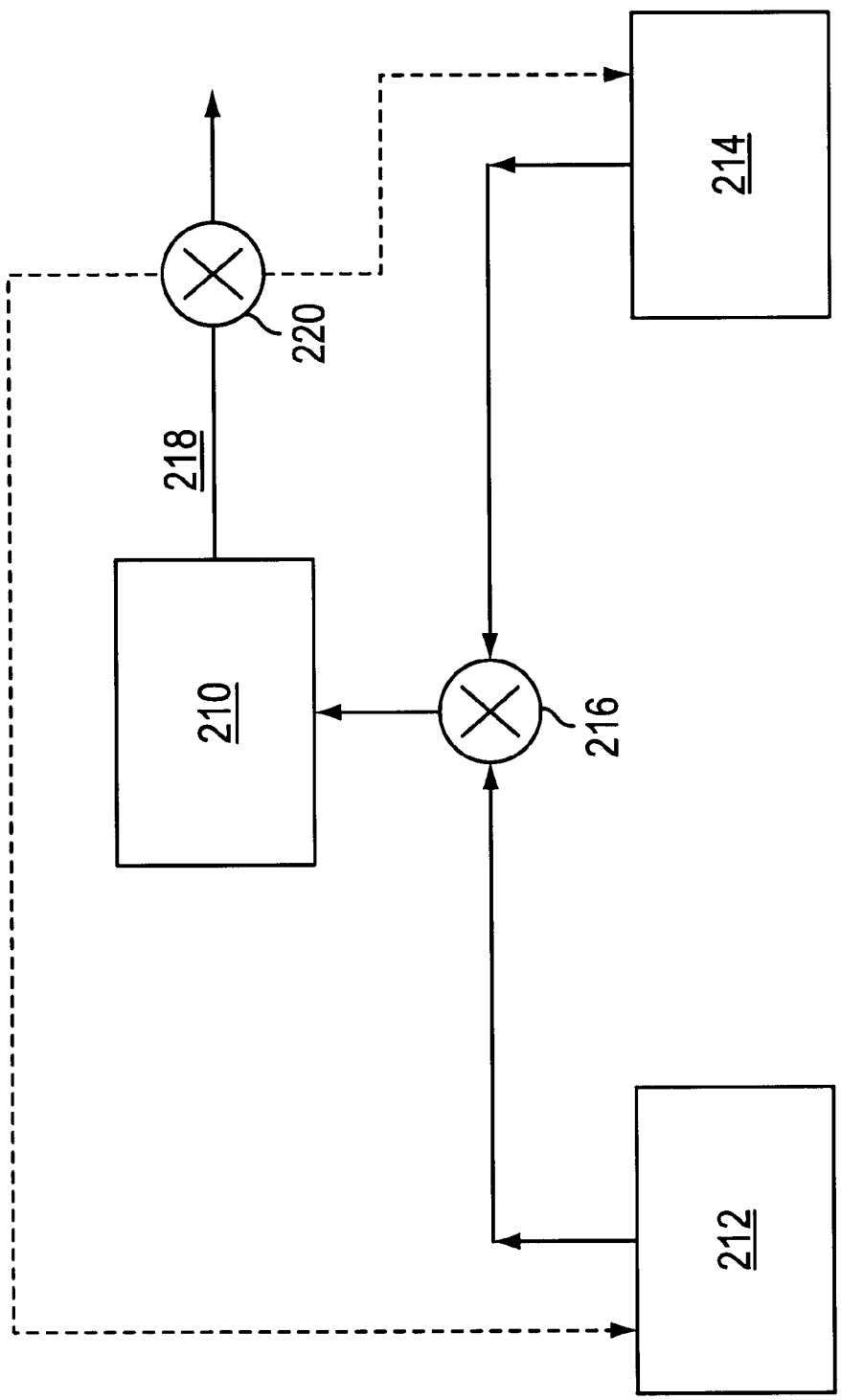
FIG. 8 is a block diagram illustrating a plating process, in accordance with an alternate embodiment of the present invention.

FIG. 8 illustrates an alternative embodiment of the present invention in which a single plating chamber 210 may be employed to perform both the first and second plating. Plating chamber 210 may include any conventional plating chamber for performing electroplating. A valve 216 is connected to the plating chamber 210 to permit plating solution from plating tanks 212 and 214 to be supplied to the plating chamber 210. According to an exemplary embodiment of the present invention, the valve 216 operates on a timer or another mechanism to allow the first plating solution from plating solution tank 212 to be delivered to the chamber 210 for a predetermined period of time. Similar to the previous description, the first plating solution contains a bottom-enhanced filling chemistry to permit the bottom of the openings 24 and 26 to be filled more quickly than the sidewalls. This helps eliminate voids in the openings and decreases the amount of deposited copper on the surface of the dielectric layer 22.

The valve 216 is opened to allow the solution from the first plating solution tank 212 to be delivered to the plating chamber 210. Power is supplied to the plating chamber 210 where the semiconductor device 300 acts as one of the two electrodes and the electroplating proceeds to deposit a layer of copper in the openings 24 and 26, similar to that illustrated in FIG. 6.

After the predetermined period of time has elapsed, i.e., a time sufficient for the first plating process to fill about 40% to about 90% of the openings 24 and 26, the valve 216 is closed. The particular time may be based on the particular semiconductor device 300 and the particular device features requiring copper deposition. Given the guidance disclosed herein, the particular time may be determined to optimize the end result, i.e., a more planar and uniform deposition of the copper over the dielectric layer 22.

According to an exemplary embodiment of the present invention, the plating solutions supplied from plating tanks 212 and 214 may also be overlapped for a brief period of time to preserve continuity and to keep the surface of semiconductor device 300 from drying or starving for plating solution. Since the solutions from plating chamber 210 do not recirculate back into the respective plating tanks 212 and 214, there is no fear of mixing both plating solutions and contaminating each plating solution.

After the valve 216 is closed and the first plating solution is substantially drained via drain line 218, the valve 216 opens to supply the solution from plating tank 214 to electroplating chamber 210. The second plating process continues until the openings 24 and 26 are filled, as illustrated in FIG. 7. As shown in FIG. 7, after the second plating process, the copper over the dielectric layer 22 is more uniform and substantially coplanar with the upper surface of the dielectric layer 22.

In an alternative embodiment, a three-way valve 220 may be connected to the plating chamber 210. In this case, the plating solution from plating tank 212 may be re-circulated back to plating tank 212, as indicated by the dashed lines in FIG. 8, during the first plating. During the period when the first and second plating solutions are overlapped, the three-way valve 220 operates to discard the mixed plating solutions to ensure that the plating solutions do not contaminate the solutions in plating tanks 212 and 214. Then when the brief overlap period is complete, the three-way valve 218 operates to re-circulate the plating solution from plating tank 214 back to plating tank 214 during the second plating, as indicated by the dashed lines in FIG. 8. In this manner, the majority of the plating solutions from plating tanks 212 and 214 may be conserved and reused for many wafers.

Figure 9:
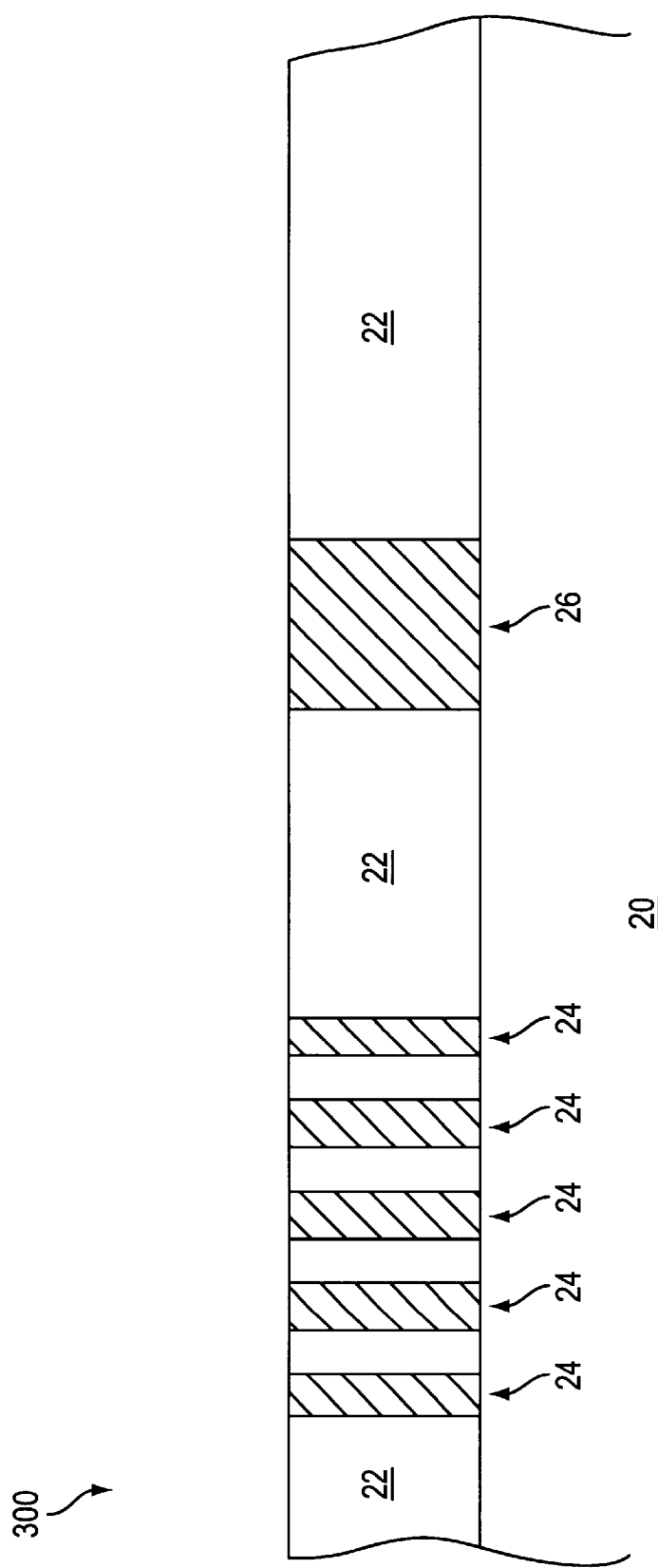
FIG. 9 illustrates the cross-section of the semiconductor device of FIG. 7 after planarization, in accordance with an embodiment of the present invention.

In any of these cases, i.e., using separate plating chambers (FIG. 5) or using a single plating chamber (FIG. 8), after the second plating process is complete, the semiconductor device 300 is planarized to remove the excess copper over the dielectric layer 22 and over the openings 24 and 26. For example, a chemical-mechanical polishing (CMP) may be performed to remove the excess copper material over the dielectric layer 22 and the filled openings 24 and 26. The result of the CMP is illustrated in FIG. 9. Advantageously, since the copper formed over the dielectric layer 22 is relatively uniform and planar, the CMP is easier to perform and results in a smoother dielectric layer 22 and the interconnects formed in openings 24 and 26 being substantially coplanar with the upper surface of the dielectric layer 22. This uniform, planar surface facilitates deposition of subsequent layers and permits these layers to be more uniformly deposited.

It should be noted that FIGS. 6, 7 and 9 do not illustrate the formation of any diffusion barrier layer that may be deposited in openings 24 and 26 prior to deposition of the copper layer 30a. Such diffusion barrier layers are well known and impede the electromigration of copper into various dielectric layers. It should also be noted that FIGS. 6, 7 and 9 do not illustrate a copper seed layer that may be deposited on a diffusion barrier layer to enhance he adhesion of the copper layer 30a during electroplating.

According to an exemplary embodiment of the present invention, a copper or a copper alloy seed layer may be deposited along the bottom and sidewall portions of the interconnect openings 24 and 26 to carry electrical current for electroplating. In depositing a relatively thin seed layer in the interconnect openings, the techniques disclosed in co-pending U.S. patent application Ser. No. 09/561,622, entitled: "Forming an Alloy Precipitate to Surround Interconnect to Minimize Electromigration," may be used.

For example, a copper alloy seed layer may be conformally deposited along the sidewalls and bottom of the respective interconnect openings 24 and 26 in semiconductor device 300. The copper alloy seed layer may be deposited via any conventional process, such as chemical vapor deposition (CVD), ionized metal plasma deposition (IMP), physical vapor deposition (PVD) or other known processes to conformally deposit a relatively thin layer in the interconnect openings 24 and 26. The dopant element in the copper alloy seed layer may include magnesium, aluminum, zinc, zirconium, tin, nickel, palladium, silver or gold. Alternatively, other dopant elements may be used to form the copper alloy seed layer. Advantageously, the doped copper seed layer essentially encapsulates the pure copper 30a and 30b, resulting in improved electromigration resistance throughout the entire interconnect structure. After the copper alloy seed layer is deposited, the first and second plating processes described with regard to FIGS. 6, 7 and 9 are performed to deposit the copper layers 30a and 30b and planarize the semiconductor device 300.

According to an alternative embodiment of the present invention, the electromigration resistance associated with copper interconnects may further be improved by depositing substantially pure copper in the first plating process and depositing doped copper in the second plating process. In this embodiment, the techniques disclosed in co-pending U.S. patent application Ser. No. 09/593,231, entitled: "Copper Interconnects with Improved Electromigration Resistance and Low Resistivity," may be used.

For example, the first plating process described in relation to FIG. 6, i.e., the bottom-enhanced plating, may deposit substantially pure copper as described above. The second plating process described in relation to FIG. 7, however, may conformally deposit doped copper in the unfilled portions of the interconnect openings 24 and 26 illustrated in FIG. 6. The dopant element used to form the copper alloy may include tin, zirconium, strontium, palladium, magnesium, chromium or tantalum. Alternatively, any other dopant element that is known to increase the electromigration resistance of copper may be used. According to an exemplary embodiment, the second plating solution may be designed so that the percentage weight of the dopant element in the copper alloy ranges from about 0.3% to about 12.0%, based on the particular dopant element and the particular circuit requirements. Other percentages of the dopant element may be used in alternate embodiments.

In this manner, a layer of substantially pure copper is formed in the bottom portion of the interconnect structure and the doped copper is formed at the surface of the semiconductor device. The resulting interconnect exhibits improved electromigration resistance at the surface area of the interconnect.

Thus, in accordance with the present invention, copper is deposited in an interconnect opening using two plating chemistries. The first plating chemistry is a bottom-enhanced filling chemistry which fills the lower portion of the interconnect opening more quickly than the side portions. The second plating chemistry is a conformal filling which completes the filling of the interconnect openings. The resulting copper layer is more uniform and planar, even over areas where the openings are located very close to each other. This permits the CMP to cause less erosion and dishing, thereby improving the reliability of the semiconductor device. The present invention is also cost effective and can be easily integrated into conventional processing.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of chemical vapor deposition (CVD) processes, including low pressure chemical vapor deposition (LPCVD) and enhanced chemical vapor deposition (ECVD) can be employed.

The present invention is applicable in the manufacturing of semiconductor devices and particularly in semiconductor devices with design features of 0.25 microns and below, resulting in increased transistor and circuit speeds and improved reliability. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

For example, the present invention has been described with the example of single level interconnects formed by created openings in a dielectric layer and filling the openings. The present invention is also applicable to other situations where interconnects are formed, such as dual damascene techniques which form a conductive via that contacts an upper trench section. In this scenario, the non-conformal plating may deposit copper in the conductive via and a portion of the conductive trench. The conformal plating may then deposit copper in the upper portion of the conductive trench.

What is claimed is:

1. A method of forming an interconnect in a semiconductor device, the method comprising:

forming an opening in a dielectric layer;

depositing copper to fill a portion of the opening using a first plating process, the first plating process employing a first plating solution designed for non-conformal filling of the opening;

depositing copper to fill the opening using a second plating process, the second plating process employing a second plating solution designed for conformally filling the opening; and planarizing the semiconductor device so that the copper-filled opening is substantially coplanar with an upper surface of the dielectric layer.

2. The method of claim 1, wherein the portion comprises about 40% to about 90% of the opening.

3. The method of claim 1, wherein the first plating solution is designed to enhance filling of bottom portions of the opening.

4. The method of claim 1, comprising:

performing the first and second plating processes in the same plating chamber.

5. The method of claim 1, further comprising:

transporting the semiconductor device to a second plating chamber before performing the second plating process.

6. The method of claim 1, wherein the opening represents at least one of a contact hole, a via hole or a trench for an interconnect line.

7. The method of claim 1, wherein the planarizing includes chemical-mechanical polishing of the semiconductor device.

8. A method of forming an interconnect in a semiconductor device, comprising:

forming an opening in a dielectric layer;

supplying a first plating solution to an electroplating chamber, the first plating solution designed for non-conformal filling of the opening;

depositing copper to fill a portion of the opening;

terminating the supply of the first plating solution after the portion is deposited;

supplying a second plating solution to the electroplating chamber, the second plating solution designed for conformal filling of the opening; and depositing copper to fill the opening.

9. The method of claim 8, further comprising:

planarizing the semiconductor device so that the copper-filled opening is substantially coplanar with an upper surface of the dielectric layer.

10. The method of claim 9, wherein the planarizing includes:

chemical-mechanical polishing the semiconductor device.

11. The method of claim 8, wherein the portion comprises about 40% to about 90% of the opening.

12. The method of claim 8, wherein the first plating solution is designed to enhance filling of lower portions of the opening.

13. A method of forming an interconnect in a semiconductor device, comprising:

forming an opening in a dielectric layer of the semiconductor device, the opening representing at least one of a contact hole, a via hole and a trench for an interconnect line;

supplying a first plating solution to a first electroplating chamber, the first plating solution designed for non-conformal filling of the opening;

depositing copper to fill a portion of the opening;

transporting the semiconductor device to a second electroplating chamber when the portion is filled;

supplying a second plating solution to the second electroplating chamber, the second plating solution designed for conformal filling of the opening; and depositing copper to fill the opening.

14. The method of claim 13, further comprising:

planarizing the semiconductor device so that the copper-filled opening is substantially coplanar with an upper surface of the dielectric layer.

15. The method of claim 14, wherein the planarizing includes:

chemical-mechanical polishing the semiconductor device.

16. The method of claim 13, wherein the portion comprises about 40% to about 90% of the opening.

17. The method of claim 13, wherein the first plating solution is designed to enhance filling of lower portions of the opening.

* * * * *